United States Patent [19]
Henley

[11] Patent Number: 5,175,504
[45] Date of Patent: Dec. 29, 1992

[54] METHOD AND APPARATUS FOR AUTOMATICALLY INSPECTING AND REPAIRING A SIMPLE MATRIX CIRCUIT PANEL

[75] Inventor: Francois J. Henley, Los Gatos, Calif.

[73] Assignee: Photon Dynamics, Inc., Milpitas, Calif.

[21] Appl. No.: 716,044

[22] Filed: Jun. 17, 1991

[51] Int. Cl.[5] .................. G01R 27/26; G01R 31/312
[52] U.S. Cl. ................................ 324/501; 324/519; 324/96; 219/121.69; 219/121.68
[58] Field of Search ............... 324/501, 519, 537, 96, 324/158 R, 158 P, 158 F, 73.1; 350/356, 374, 376; 356/364, 367, 368, 397, 2; 382/58, 62, 65, 69; 219/121.68, 121.69

[56] References Cited

U.S. PATENT DOCUMENTS

| | | |
|---|---|---|
| 3,992,663 | 11/1976 | Seddick . |
| 4,242,635 | 12/1980 | Burns . |
| 4,355,278 | 10/1982 | Burns et al. . |
| 4,368,523 | 1/1983 | Kawate . |
| 4,444,801 | 4/1984 | Hongo et al. . |
| 4,463,073 | 7/1984 | Miyauchi et al. . |
| 4,507,605 | 3/1985 | Geisel . |
| 4,510,222 | 4/1985 | Okunaka et al. . |
| 4,542,333 | 9/1985 | Koontz . |
| 4,563,093 | 1/1986 | Tada et al. . |
| 4,631,576 | 12/1986 | St. John . |
| 4,633,242 | 12/1986 | Sekiya . |
| 4,636,403 | 1/1987 | Fisanick et al. . |
| 4,727,234 | 2/1988 | Oprysko et al. . |
| 4,776,022 | 10/1988 | Fox et al. . |
| 4,819,038 | 4/1989 | Alt . |
| 4,825,201 | 4/1989 | Watanabe et al. . |
| 4,862,075 | 8/1989 | Choi et al. . |
| 4,868,492 | 9/1989 | Beha et al. . |
| 4,875,006 | 10/1989 | Henley et al. . |
| 4,899,105 | 2/1990 | Akiyama . |
| 4,975,635 | 12/1990 | Takahaski et al. . |
| 4,983,911 | 1/1991 | Henley . |
| 4,999,577 | 3/1991 | Beha et al. . |
| 5,017,755 | 5/1991 | Yahagi et al. . |
| 5,034,683 | 7/1991 | Takahashi et al. . |
| 5,043,297 | 8/1991 | Suzuki et al. . |

FOREIGN PATENT DOCUMENTS

| | | |
|---|---|---|
| 3111393 | 9/1982 | Fed. Rep. of Germany . |
| 56-153262 | 11/1981 | Japan . |
| 56-154678 | 11/1981 | Japan . |
| 58-99768 | 6/1983 | Japan . |

OTHER PUBLICATIONS

Henley, "Electro-Optic Technology Support Giga-Hertz Test Speeds", *Electronics Test*, Sep. 1988.
Barton, "Characterization of High-Speed (Above 500 MHz) Devices Using Advanced ATE-Techniques, Results and Device Problems", *ITC*, Aug. 1989.
Henley, "An Ultra High Speed Test System", *IEEE*, Feb. 1989, pp. 18–24.
Novellino, "Electro-Optic Device Tester Tops 1-GHz", *Electronic Design*, Sep. 8, 1988.
McCarty, "System Tests Devices at GHz Rates", *Design News*, Apr. 10, 1989.
Luo, et al., "Testing and Qualifications of a-Si TFT-LC Color Cells for Military Avionics Applications", *SID 90 Digest* Dec. 1990.
Becker, et al., "Measurement of Electro-Optic Characteristics of LCDs", *SID 90 Digest* Dec. 1990.

*Primary Examiner*—Jack B. Harvey
*Attorney, Agent, or Firm*—Townsend and Townsend

[57] ABSTRACT

Circuit panels, such as LCD panels, are inspected in-process and after final assembly to identify defects. Prior to final assembly, panels identified as having sufficiently few defects are repaired. Similarly after final assembly, panels identified as having sufficiently few defects are repaired. The inspection and repair systems are linked through a repair file. The inspection system identifies each defect by type and location and includes such information in the repair file. The repair system accesses such file and follows a prescribed repair method for a given type of defect at the location of such defect. Simple matrix panel defects include open line defects and line to line shorts. The inspection system includes an automated non-contact capacitance imaging system. The repair system may include a pair of lasers and a film dispenser. A first laser is used to selectively remove material and cut lines. The dispenser is for applying a liquid organic metallic film in the defect area. The second laser is for tracing a line in the film to form a conductive path repairing the defect.

9 Claims, 6 Drawing Sheets

METHOD AND APPARATUS FOR AUTOMATICALLY INSPECTING AND REPAIRING A SIMPLE MATRIX CIRCUIT PANEL

CROSS REFERENCE TO RELATED APPLICATIONS

This invention is related to the commonly-assigned U.S. patent applications, Ser. No. 07/658,132, filed Feb. 19, 1991 for CAPACITANCE IMAGING SYSTEM USING ELECTRO-OPTICS and Ser. No. 07/687,473, filed Apr. 18, 1991 for LASER-BASED SYSTEM FOR DEPOSITION AND REMOVAL. Such patent and patent applications are incorporated herein by reference and made a part hereof.

BACKGROUND OF THE INVENTION

This invention relates to a method and apparatus for automatically inspecting and repairing simple matrix circuit panels. Inspection is achieved by electro-optic capacitance imaging, while repair is achieved by laser cutting and material deposition. The imaging process results in the generation of a list of panel defects, including the type and location of each defect. Automated repair then is performed by accessing such list to identify the defect type and location. Prescribed repair operations are performed based upon the type defect and location.

One specific application is for simple matrix LCD panels. Such panels are formed by a pair of transparent simple matrix panels coupled together. Each panel includes multiple, substantially parallel conductive lines typically formed with indium tin oxide ("ITO lines") or another transparent or translucent material. The two panels are coupled so that the lines on one panel are orthogonally oriented with respect to the lines on the other panel. To assemble the simple matrix LCD panel the two simple matrix panels are sandwiched together with liquid crystal injected between the panels. When lines on each panel become energized, the liquid crystal at an intersection point between the lines will change polarization in the liquid crystal material in proportion to the rms voltage differential so as to define a pixel.

Known methods for inspecting simple matrix panels for defects include optical inspection in which each panel is viewed to identify an area which does not conform to a particular appearance. Such a test, however, is not functional and does not determine with certainty that a defect in fact is present at such location.

Another method for inspecting is to perform resistance testing by applying probes to ITO lines. A simple matrix panel prior to assembly has alternating rows of ITO lines that are shorted to a shorting bar. The intermittent rows are left "open" without electrical coupling to a shorting bar. To perform the resistance testing, probes are coupled to the open ITO lines and grounded to the shorting bar. A signal then is applied to the probes. If any resistance is measured between the probes and ground, then a short circuit is present. Such a method, thus identifies whether a short circuit defect is present, but does not identify the location of the defect.

Accordingly, an improved testing (inspection) method is needed which can identify the presence and location of simple matrix panel defects with reliability.

For high density simple matrix LCD panels, for example, a typical yield of shipped panels is less than about 50% to 75%. Because of the significant percentage of defective panels, it is common to test all (100%) of the manufactured panels.

Accordingly, there is a need for an automatic system for identifying defects early in the manufacturing process to avoid further manufacturing steps for panels having a large number of defects. Further, there is a need for a method and apparatus for repairing panels having sufficiently few defects. In addition, there is a need for automating and linking the inspection and repair processes so as to increase the system throughput.

SUMMARY OF THE INVENTION

According to the invention, inspection and repair of partially assembled and/or fully assembled high density simple matrix LCD panels is performed to improve production yields. A test system inspects the panel for line defects and generates a file or record of defect information. Based on the record of defect information, the panels are either repaired or discarded. Panels having excessive defects are discarded prior to final assembly to avoid many costs attributable to the subsequent steps leading to final assembly. Panels having manageable defects are repaired. Various repair strategies may be applied. An inspection after final assembly identifies further potentially repairable defects.

According to one aspect of the invention, a capacitive image system is used on a simple matrix panel to identify line-to-line shorts and open circuit panel defects. The panel is inspected by extracting a two-dimensional image of the capacitance distribution across the surface of the panel under test (PUT) through illumination of a modulator placed adjacent the surface, such as an NCAP modulator or other liquid dispersed polymer-based devices. The light modulator is disposed to allow longitudinal probing geometries to develop a measurement of capacitance across a gap between the surface of the panel under test and the opposing face of the modulator, whereby optical energy is power modulated and observed through an area optical sensor (such as a camera). The resultant signals may be used directly to produce a two-dimensional spatially-dependent power modulation image directly corresponding to the capacitance states across the surface of the panel under test.

According to another aspect of the invention, open circuit defect testing is performed prior to assembly by scanning the conductive lines of a simple matrix panel while the lines are shorted at an applied shorting strip (e.g., elastomer strip) and while a voltage signal is applied at a built-in shorting bar. Scanning is performed by means of the modulator of the capacitive imaging system. The modulator images a partial area of the panel at a given time. For conductive lines having no defects, the conducting lines appear as active lines of approximately equal intensity. For areas where there is no conductivity, the image appears dark (i.e., black). Thus, if an open circuit defect occurs on a line within the image area, at least a portion of such line will be dark. If a transition occurs on the line within the image area, then the defect location is at the transition point in the image area. If the entire portion of a line within the image area appears dark, then the line has an open circuit defect outside the image area. The modulator thus scans along such line to identify the precise location of the open circuit defect. The location of the open circuit then is identified based on the position of the modulator and the position of the defect within the image area.

According to another aspect of the invention, an optimal two cycle approach for identifying and locating open circuit defects is performed. During a first cycle, the conductive lines are scanned by moving the modulator across each line and counting the number of lines having an open circuit defect. If the number is more than a prescribed number, and thus, repair would not be cost effective, then the panel is discarded as defective. As such testing occurs while inspecting a single panel prior to assembly into a finished LCD panel, the expense of materials and labor for the remaining assembly is avoided. If the number of defects is less than the prescribed number, then a second pass is performed during which the each line having an open defect is scanned to identify the location of the open circuit defect along such line.

According to another aspect of the invention, short circuit testing is performed by removing the applied shorting strips previously applied during the open circuit testing. With a voltage signal applied to the built-in shorting bar, the modulator of the capacitive imaging system then scans the conductive lines. For a conventional simple matrix panel, alternative lines are coupled to the built-in shorting bar. Thus, by applying a voltage signal to the built-in shorting bar(s), only the alternative lines coupled to the built-in shorting bar should appear active. Accordingly, if the image area of the modulator detects adjacent lines that are active, then a short circuit is present between such lines. If the short circuit occurs along a portion of the lines within the image area, then the short circuit path between the two lines will be active. If the short circuit does not occur in the image area, then the adjacent lines both are active but the short circuit path is not evident. Thus, the modulator scans along the shorted lines to capture the short circuit path in the image area. The location of the short circuit then is identified based on the position of the modulator and the position of the defect within the image area.

According to another aspect of the invention, a laser-based repair and deposition system receives a repair file generated by the capacitance imaging system. The repair file identifies the location and type of each panel defect. The repair system automatically positions the panel and a cutting laser in the vicinity of each defect. The laser then selectively removes passivation material to expose conductive paths. Additionally the laser may cut conductive lines to sever a short circuit. Thereafter, an organic metallic film is deposited and dried. A laser then traces a line in the film to decompose the film along the line to form a conductive path. The laser traces such line so as to repair the open circuit. Excess film then is cleaned away.

According to another aspect of the invention, the repair methodology includes using a laser to open contact holes in passivation or other layers in preparation for material deposition. A solid state film then is applied automatically onto a defect area and dried. Another laser then forms a conductive line with the film by tracing a line. The location of such line is selected to repair the panel defect. Such writing speed is approximately 100 to 300 micrometers per second. The excess film then is cleaned away.

According to another aspect of the invention, automated prescribed repair operations are performed at a given pixel defect location based upon the type of defect identified. For an open circuit defect, the passivation is removed in the area of the open circuit, including an area over each side of a disconnected conductive line. The film then is deposited and the laser traces a line so as to connect the previously disconnected line. For a line to line short, passivation may be removed, if present, then the conductive connection between the adjacent lines is cut to remove the short circuit path.

The invention will be better understood upon reference to the following description of specific embodiments in connection with the accompanying drawings.

DESCRIPTION OF SPECIFIC EMBODIMENTS

Simple Matrix Circuit Panel

Figure 1:
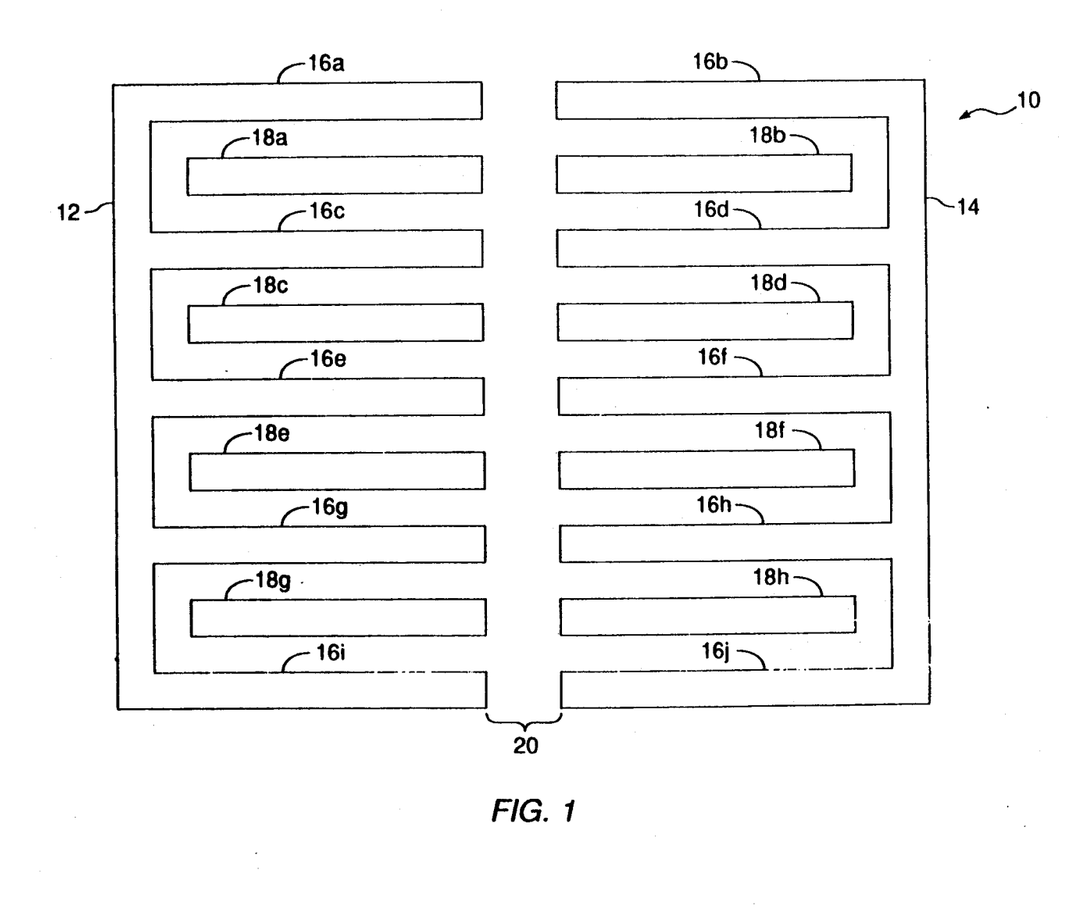
FIG. 1 is a diagram of a conductive line pattern for a conventional simple matrix panel.

FIG. 1 is a diagram of one simple matrix panel 10 used in forming a simple matrix LCD panel. As depicted, panel 10 includes a pattern of conductive lines 11. In one conventional embodiment, the pattern includes a central gap 20 so that the lines 11 are driven from each side of the display. Built-in shorting bars 12, 14 are included which are electrically coupled to alternative lines 16. Other lines 18 are left open without connection to the built-in shorting bars 12, 14. Line widths of approximately 100 microns are common with gaps between lines of approximately 20 microns. Typically the lines 16, 18 are formed with indium tin oxide, although other materials may be used. During final assembly two panels 10 are coupled together so that the lines 16, 18 of each panel are orthogonal and thus form a matrix of intersections. Liquid crystal is injected between the panels. When lines on each panel are correctly activated, the intersections light up. Thus, the intersection of lines on each panel, along with the intermediate liquid crystal material, define a pixel.

Prior to assembly there are no intersections. Thus, simple matrix panel defects include line to line short circuit defects and open circuit defects.

Following is a description of a capacitive imaging test system embodiment used for inspecting the panel 10, although other imaging system embodiments may be used. An example of the capacitance imaging test system is more fully described in commonly-assigned U.S. patent application Ser. No. 07/658,132, filed Feb. 19, 1991 for CAPACITANCE IMAGING SYSTEM USING ELECTRO-OPTICS. As previously recited, such patent application is incorporated herein by reference and made a part hereof.

Capacitance Imaging Test System

Figure 2:
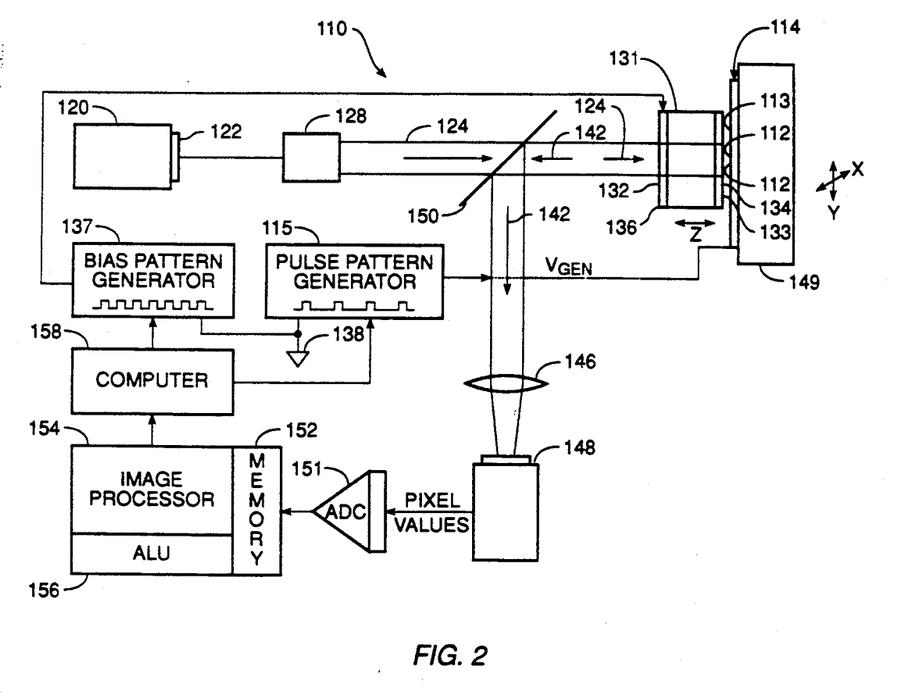
FIG. 2 is a block diagram of a capacitance imaging system.

The capacitance imaging system has particular application to non-invasive testing of high-density simple matrix liquid crystal display (LCD) panels wherein the conductors thereof are highly conductive as compared to surrounding areas. FIG. 2 illustrates an embodiment of a capacitance imaging system 110 for observing voltage at a large plurality of positions 112 on strips 113 on a surface 114 of a plate 10 or panel under test (PUT) forming a portion of a simple matrix LCD panel. A key element of the system 110 is an optical modulator 131, the light transmissivity of which is controlled by the differential in voltage at each location between a first face 132 and a second face 134.

The PUT 10 is a panel of glass upon which are strips 16, 18 of highly-conductive, optically-transparent material such as indium tin oxide (ITO), which may be only a few hundred to a few thousand Angstroms thick, nominally separated on the glass surface by as little as about 20 $\mu$m. The strips 16, 18 of the PUT 10 may be connected to a source of input voltage, in particular a pulse generator 115 referenced to a common ground 138 in order to produce voltages at selected times and at selected sites on the surface of the PUT 10 opposing the modulator 131.

In order to probe the voltage, there is first a source 120 of optical energy, such as a xenon, sodium, or quartz halogen lamp, a pulsed or continuous LED, laser or the like. The source optical energy is channeled into a source beam 122 and processed to produce an optical input beam 124 which may expanded and collimated with a beam expander 128. For this purpose, there may be provided a lens, mirror or fiber optic system 128 to expand and collimate the source beam into the input beam 124. The collimated input beam 124 preferably has a constant or at least known power density cross-section.

The input beam 124 is directed into electro-optic modulator means 131 of a specific type, structure and possibly atomic or molecular axis orientation. A suitable modulator 131 may be a modulator fabricated of an NCAP or PDLC material in the form of a film. This power modulator means 131 utilizes the light scattering properties of liquid crystal droplets encapsulated in a polymer matrix. The encapsulation structure produces a curvilinear alignment of the liquid crystal molecules, and this aligned phase can be optically switched by a controlled electric field as desired between opposing faces 132 and 134. The device is therefore switchable from a highly light scattering state to a highly transmissive state.

Choice of the point of bias and choice of the voltage excursion across the modulator means 131 are important factors affecting the operation of modulator means 131 as a mechanism for sensing capacitance and thereby conductivity at a position 112 on the PUT 10. The electro-optic modulator means 131 with its first face 132 and opposing second face 134 allows longitudinal probing geometries. The first face 132 has a conductive coating 136 which is transparent, such as indium tin oxide (ITO), and which is electrically coupled through a bias pattern generator 137 to a voltage common ground 138, such as ground. The bias pattern generator 137 preferably provides a pulsed voltage pattern to establish an rms voltage differential relative to a testing voltage, as applied to the PUT 10, as hereinafter explained. The second face 134 of modulator means 131 has a highly-reflective nonconductive coating 133, which produces a retro-reflection of the input beam 124 at each point 112, as represented by incident rays and corresponding reflected rays. The reflective coating 133 may be a dielectric coating or stack of dielectric material. The second face 134 is disposed adjacent the surface 114 of the PUT 10 as separated by an air gap Z, which is held to about 10 $\mu$m.

A circuit is formed at each point on the surface 114 of the PUT 10 which is useful for measuring relative capacitance at each of those points without surface contact. The circuit is formed by the series connection of bias generator 137 $V_{bias}$ with the voltage drop across the modulator 131 $V_{(NCAP)}$ at each position, the voltage drop across the air gap $V_{air}$ at each position and the pulsed excitation voltage source 115 $V_{gen}$, which is coupled to a common ground 138 with the bias generator 137. The voltage at each position across the modulator means 131 is thus given by:

$$V_{(NCAP)} = (|V_{bias} - V_{gen}|) * (C_{air})/(C_{NCAP} + C_{air}),$$

where:

$C_{air}$ is an effective capacitance per unit area, which is the series capacitance of the air gap capacitance with the surface capacitance of the underlying region of the panel under test, which may be very small for a nonconductive region or very large for an electrically-connected conductive region, and $C_{NCAP}$ is the capacitance per unit area of the modulator means 131.

The separation between the second face 134 and the surface 114 is controlled, preferably being as close as practical without causing side effects, such as shorts, thermal transfer or mechanical distortion due to stress. The selection of the spacing is made to maximize the ratio of signal to noise, particularly noise attributable to cross-talk from electric fields produced by adjacent points of voltage. A working rule is to place the second face 134 of the modulator relative to the surface 114 at less than the distance between positions 112 and preferably no more than 30% of the diameter of the pixel area. The separation may be controlled by a mechanical positioner, such as a movable table arrangement 149.

In order to extract the information, means are provided for detecting the change in transmissivity in the image across the output beam 142 to analyze the voltages at each excited position. Referring to FIG. 2, the detectors may comprise means such as a sensitive camera 148 receiving light through for example a focussing lens 146. The output beam 142 is separated from the collinear input beam 124 by means of a beam splitter 150. As a still further alternative, the input beam and the output beam can be separated by orienting the reflective surface 133 of the phase modulator 131 so that it is not perpendicular to the incident radiation. The output beam 42 is thus separated upon reflection, and a beam splitter is not needed.

The beam splitter 150 intercepts the spatially-dependent power modulation, producing, as seen by the camera, an observable map in two dimensions having features corresponding to conductance on the panel under test 10. For example, a short between adjacent strips 16, 18 will be immediately apparent as a bridge in the viewfinder of a camera 148. Opens in any strip 16, 18 will also be immediately apparent as a transition between a strip of maximum transmissivity and a region of minimum transmissivity. Moreover, such region will appear as maximally dark because of combined capacitance of the substrate in the region will be substantially smaller than when the line has continuity, therefore recuding $C_{AIR}$ and therefore $V_{NCAP}$.

There are two potentially-variable voltage sources, both synchronized so the optical sensor views only an image as a result of a differential voltage through the electro-optic modulator 131. The beam exiting the modulator 131, which in this example has made two passes through the modulator, therefore contains spatially modulated light power which carries information regarding the voltage at each point 112 across the modulator 131. The bias pattern generator 137 applies a bias of a pulse width modulated pattern to the modulator 131 under the control of computer 158. The pulse pattern generator 115, however, modulates the strips 113 on the panel under test.

Image processing can be used to enhance the image and null out offsets in the image. The pulse pattern generator 115 is particularly useful for this purpose. Through manipulation in digitized format of multiple images under different bias conditions captured by the camera 148, offsets in image contrast can be virtually cancelled. To this end, pixel values are output from the camera 148 through an analog to digital converter 151 to a memory unit 152 to accumulate a first image in a first bias state and a second image in a second bias state. An image processor 154 with a suitable arithmetic logic unit (ALU) 156 compares by subtraction the two stored images. For nonconductive regions, there will be no difference. For conductive regions, there will be a clear subtraction visible as a net change.

Open Circuit Defect Inspection

Figure 3:
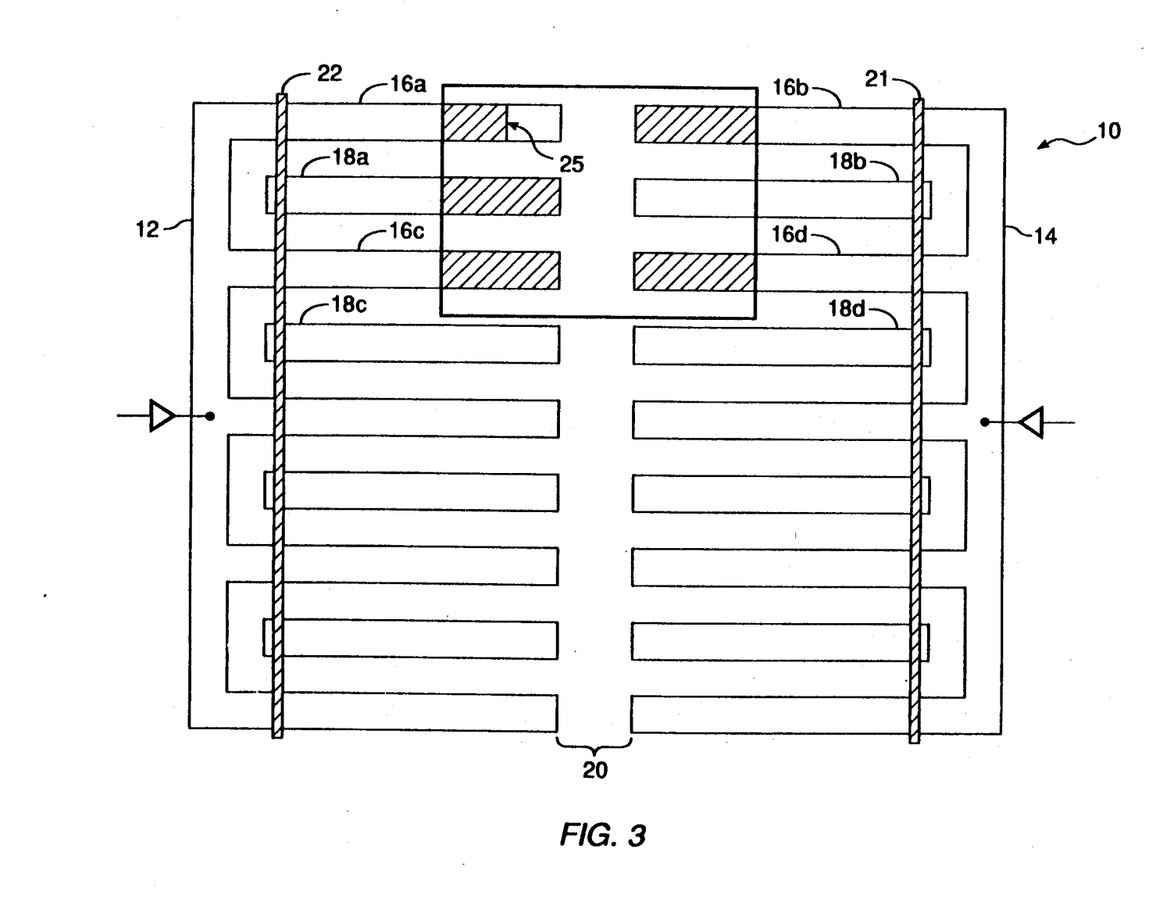
FIG. 3 is a diagram of the simple matrix panel of FIG. 1 as configured for open circuit defect inspection.

Open circuit defect testing may be performed prior to final assembly and after final assembly by scanning the conductive lines 16, 18 of the simple matrix panel 10 while the lines 16, 18 are shorted at an applied shorting strip 22, 24. A voltage signal is applied at the built-in shorting bars 12, 14. The modulator 131 images a partial area of the panel 10 at a given time. For defect-free lines 16, 18 the lines appear with approximately equal intensity. For areas where there is no conductivity, the image appears dark (i.e., black). Thus, if an open circuit defect occurs on a line within the image area, at least a portion of such line will be dark. If a transition 25 occurs on a line 16a within the image area, then the defect location is at the transition point 25 in the image area. If the entire portion of a line 18b within the image area appears dark, then the line 18b has an open circuit defect outside the image area. The modulator 131, thus, scans along such line 18b to identify the precise location of the open circuit defect. The location of the open circuit then is identified based on the position of the modulator 131 and the position of the defect within the image area.

As described, open circuit line defects are detected using the capacitance imaging system 110. FIG. 3 shows the simple matrix panel 10 in an open circuit test configuration. The panel 10 receives a voltage signal at the built-in shorting bars 12, 14, while the conductive lines 16, 18 on each half of the panel are shorted. For a panel 10 having a center gap 20 an applied shorting bar 22 (i.e., elastomer) is placed across each line 16, 18 on one side of the gap 20, while another applied shorting bar 24 is placed across each line 16, 18 on the other side of the gap 20. For a panel 10 having no open line defects every line 16, 18 is activated. The entire length of each such lines 16, 18 then appear as active lines on a capacitance image. For lines having open defects, the areas which are open circuits are not active and thus appear dark on a capacitance image.

Modulator 131 is depicted in FIG. 3 to scan an area of the panel 10. The shaded areas indicate active areas which are conducting, the unshaded areas within the line boundaries are inactive. The scan area shown includes two lines 16a and 18b which have areas which are not active. Line 16a has a transition 25 between the active area and inactive area within the field of the modulator 31. Thus, the precise location of the defect is identified from the position of the modulator 131 and the position of the transition point 25 with the scanning area of the modulator 131. According to one embodiment such location is identified in pixel or x,y coordinates and stored in a repair file. The type of defect (e.g., open circuit line defect) also is stored in the repair file.

With regard to line 18b, the entire portion of the line within the scanning area is inactive. Thus, the open circuit defect occurs on line 18b, but at another portion of the line outside the scanning area of modulator 131. To locate the precise location of the defect on line 18b, the modulator scans along the line 18b bringing the transition point between the active portion and inactive portions of line 18b into the scanning area. Based on the new position of the modulator 131 relative to the panel 10 and the position of the transition point within such new image area, the precise location of the defect is identified. The location and type of such defect are then stored in the repair file.

To optimize the inspection methodology, two cycles preferably are used for identifying and locating open circuit defects. During a first cycle, the lines 16, 18 are scanned by moving the modulator 131 orthogonally across each line and counting the number of lines having dark areas. If the number is more than a prescribed number (and thus, repair would not be cost effective), then the panel 10 is discarded as defective. For inspections performed prior to assembly into a finished LCD panel, the expense of materials and labor for the remaining assembly is avoided. If the number of defects is less than a prescribed number, then a second pass is performed during which lines having an open defect are scanned to identify the location of the open circuit defect along such line.

Short Circuit Defect Inspection

Figure 4:
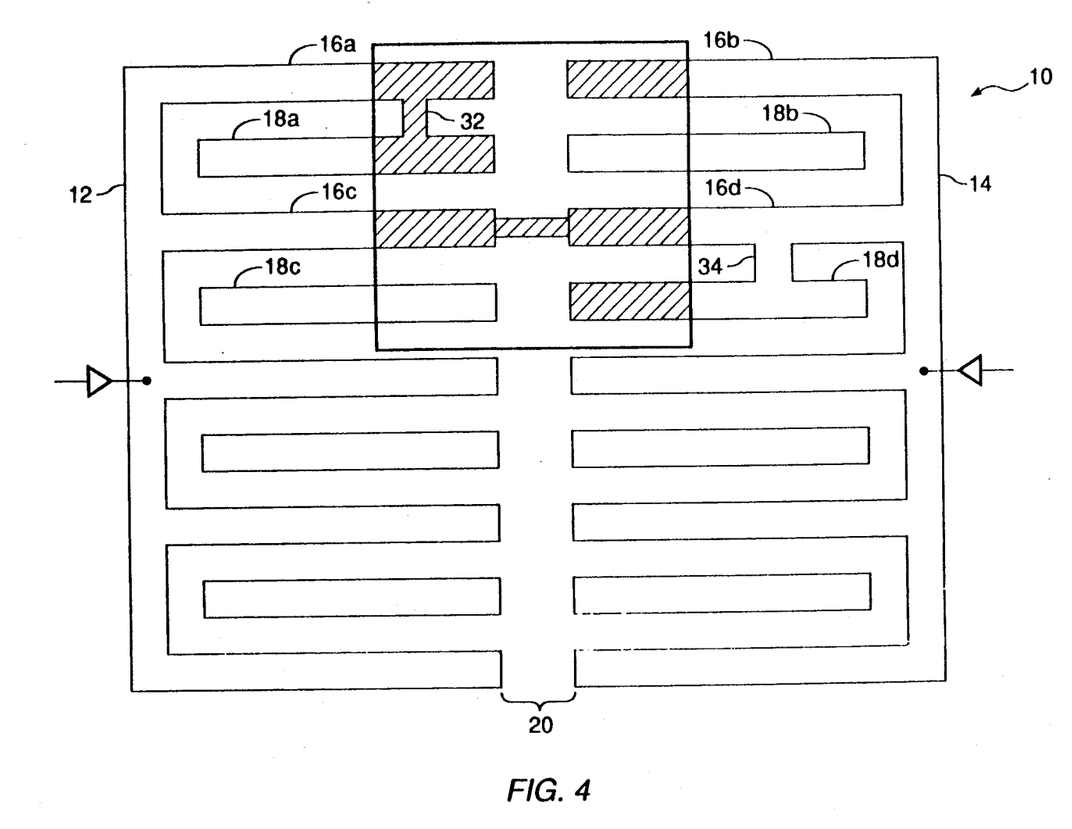
FIG. 4 is a diagram of the simple matrix panel of FIG. 1 as configured for short circuit defect inspection.

Short circuit testing is performed by removing the applied shorting strips 20, 22 and applying a voltage signal to the built-in shorting bars 12, 14. According to a conventional pre-assembled simple matrix panel alternative lines are coupled to the built-in shorting bars 12, 14. Thus, by applying a voltage signal to the built-in shorting bars 12, 14, only the alternative lines 16 coupled to the built-in shorting bars 12, 14 are activated for a panel having no short circuit defects. Accordingly, if the scanning area of the modulator 131 detects adjacent lines 16a, 18a that are active, then a short circuit is present between such lines 16a, 18a. If the short circuit occurs along a portion of the lines within the scanning area, then the short circuit path 32 between the two lines 16a, 18a will be active. If the short circuit does not occur in the scanning area, then the adjacent lines 16c, 18c both are active but the short circuit path 34 is not evident. Thus, the modulator 131 scans along the shorted lines 16c, 18c to capture the short circuit path 34 in the image area. The location of the short circuit then is identified based on the position of the modulator 131 and the position of the defect within the scanning area.

Laser-Based Repair System

Figure 5:
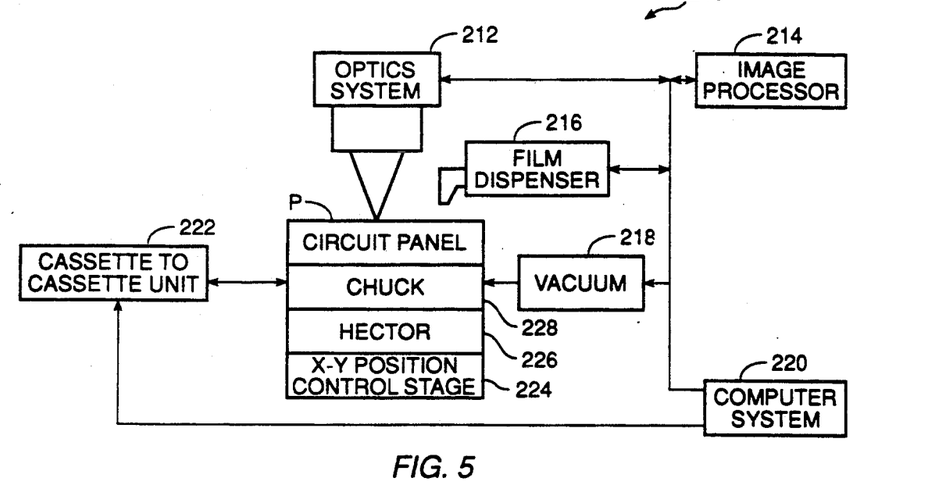
FIG. 5 is a block diagram of a laser-based repair and deposition system.

FIG. 5 shows one exemplary embodiment of the laser-based repair system 210. A system is more fully described in commonly-assigned U.S. patent application No. 07/687,473, filed Apr. 18, 1991 for LASER-BASED SYSTEM FOR DEPOSITION AND REMOVAL. As previously recited, such patent application is incorporated herein by reference and made a part hereof. The function of the repair system 210 is to repair panel defects identified by the inspection system 110.

The repair system 210 includes optics system 212, image processor 214, rebuilding means such as a film depositor 216, vacuum 218, computer 220, cassette unit 222, position control stage 224, optional heater 226 and chuck 228. Several panels are stored in a cassette unit 222 for automatic retrieval. Circuit panel P is retrieved from the cassette unit 222 and positioned on chuck 228. Vacuum 218 holds the panel P to the chuck.

The panel is aligned with the optics system by the X-Y position stage 224. The optics system 212 feeds back image information to the computer system 220 through the image processor to identify the alignment. Based upon such feedback, the computer system 220 controls the X-Y stage 224 to properly position the panel P.

To repair defects on a circuit panel P, the computer system 220 accesses a repair file generated by a test system 10, 110 and input to the computer system 220. Such file includes panel defect information including the type of defect and the location of the defect. Based upon such information, the computer system 220 causes the optics system 212 to position an eximer laser in the vicinity of a defect to be repaired. Depending on the type of defect, the eximer laser performs prescribed operations to remove selective material and cut conductive lines. Select passivation (i.e., silicon nitride) is removed without disturbing the conductive lines below.

Thereafter, the rebuild means provides alternative conductive paths. In a specific embodiment, the film dispenser 216 deposits a film over an area of the panel in the vicinity of the defect. According to one embodiment, the film is a palladium acetate film or other organic metallic film (e.g., solid-state film). The dispenser 216 deposits film of approximately 5 to 20 millimeters in width over a given length, which may exceed 1 centimeter. In liquid form, the film is approximately 30 microns thick. An optional heater 226 heats the panel P to enhance drying of the film. When drying, evaporation causes the film thickness to reduce to approximately one micron.

Once dry, another laser of the optics system 212, an argon-ion laser, then traces a line on the film so as to decompose the line of film and form a conductive path. The line becomes conductive by a photo-pyrolytic reaction between the light and the film. The decomposition process turns the approximately one micron thick film line to an approximately 0.1 micron thick conductive path. A vapor phase isopropyl alcohol cleaning agent then is used to remove the excess film.

Open Circuit Defect Repair

Figure 6A:
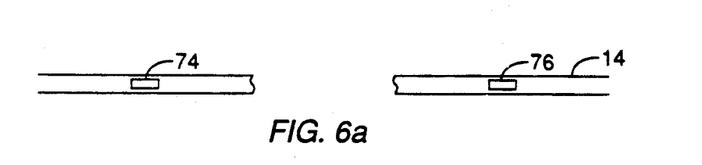
FIGS. 6a and 6b depict a repair process for an open circuit defect.
Figure 6B:
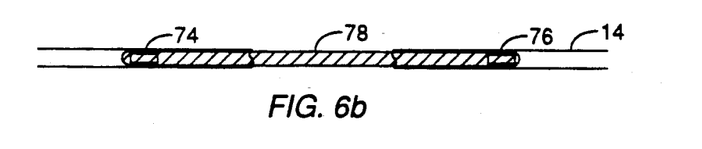

FIG. 6a shows a conductive line 13 having an open circuit defect. To repair the defect, passivation covering the conductive line (if it is present) is removed on each side of the open circuit at areas 74, 76. Film then is deposited and a laser applied as described above to form a conductive path 78 which contacts each of the exposed areas 74, 76 (FIG. 6b).

Line-to-Line Short Circuit Repair

Figure 7A:
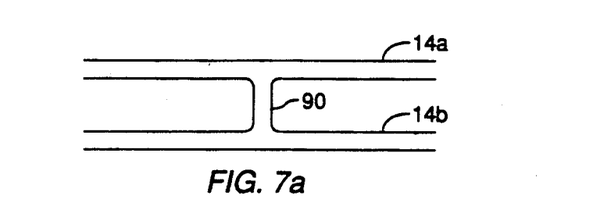
FIGS. 7a and 7b depict a repair process for a line-to-line short circuit defect.
Figure 7B:
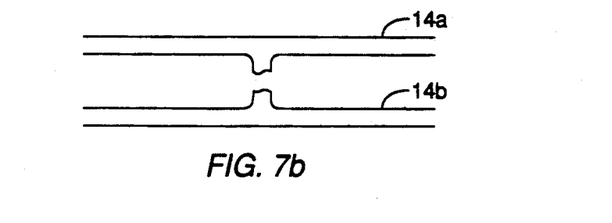

FIG. 7a shows a line-to-line short 90 between two lines 16a, 18a. To repair the short the laser cuts the conductive path at short 90 to separate the lines 16a, 18a (FIG. 7b).

Conclusion

Figure 8:
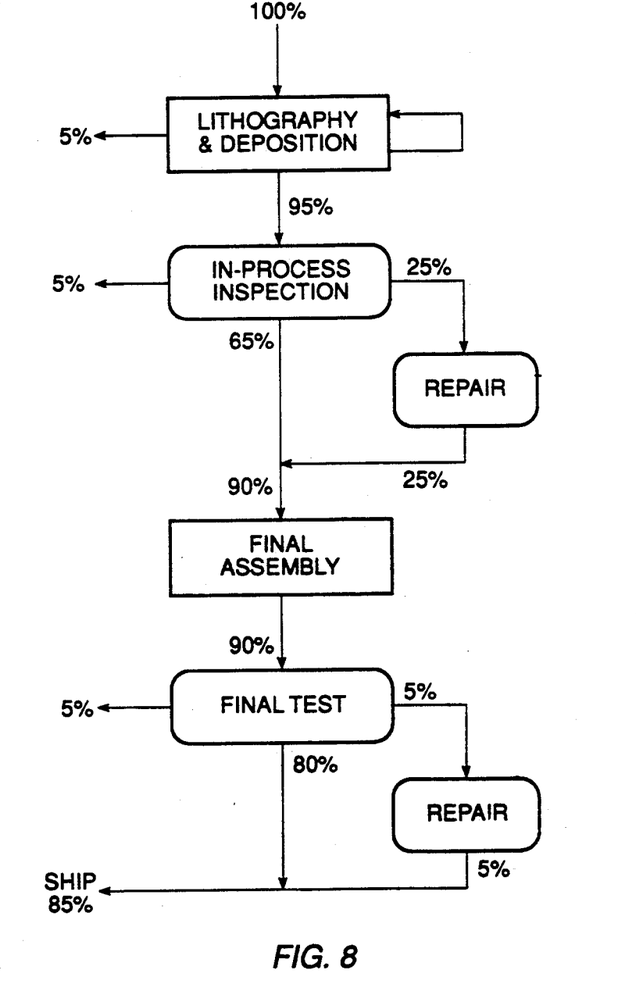
FIG. 8 is a flow chart of a simple matrix LCD production process, including the inspection and repair processes of this invention.

FIG. 8 shows a process flow for the fabrication of a simple matrix LCD which undergoes inspection and repair according to an embodiment of this invention. A batch of panels (100%) undergoes lithography and deposition processing to form the unfinished active matrix panel. Based on typical yields, approximately 5% are discarded during such processing as defective. Thus, 95% of the panels undergo in-process inspection. Approximately 65% of the original batch pass inspection as having no defects. Approximately 5% of the original batch are discarded as being too defective to repair. The remaining 25% undergo the repair process, as described above. Thus, 90% of the original batch make it to final assembly. After final assembly, approximately 80% of the original batch pass inspection as having no defects. Approximately 5% are discarded as being too defective to repair. The remaining 5% are repaired. Thus, 85% of the original batch are available for shipment. Such a yield is a significant improvement over the typical yields known in the industry for systems unable to provide panel defect repair.

The invention has now been described with reference to specific embodiments. Other embodiments will be apparent to those of ordinary skill in the art. It is therefore not intended that this invention be limited, except as indicated in the appended claims.

What is claimed is:

1. A method for inspecting a circuit panel having a plurality of conductive lines, comprising the steps of:
   shorting said plurality of conductive lines;
   applying a test signal to said shorted plurality of conductive lines;
   capturing a capacitance image of an area of the panel;
   identifying an open circuit line defect from the capacitance image;
   identifying a location of said open circuit line defect; and
   storing said location and a corresponding indication signifying an open circuit line defect.

2. A method for inspecting a circuit panel having a plurality of substantially parallel, conductive lines and a built-in shorting means coupled to alternate conductive lines, the method comprising the steps of:
   applying a second shorting means across a plurality of conductive lines to short said plurality of conductive lines;
   applying a first test signal to either one of the built-in shorting means and the second shorting means;
   capturing a capacitance image of a first area of the panel;
   identifying an open circuit line defect from the capacitance image;
   identifying a location of said open circuit line defect; and
   storing said location and a corresponding indication signifying an open circuit line defect.

3. The method of claim 2, further comprising the steps of:

removing said second shorting means;

applying a second test signal to the built-in shorting means;

capturing a second capacitance image of a second area of the panel;

identifying a short circuit line defect from the second capacitance image;

identifying a location of said short circuit line defect; and storing said location and a corresponding indication signifying a short circuit line defect.

4. An apparatus for automatically inspecting and repairing a simple matrix circuit panel, said panel having a plurality of substantially parallel conductive lines and a built-in shorting bar coupled to alternate conductive lines, comprising:

means for applying a test signal to said built-in shorting bar;

means for capturing a capacitance image of a portion of said panel while said test signal is applied;

means for identifying panel defects from said captured image;

means for storing panel defect information including defect type data and defect location data;

laser means for removing selective material from a location of said panel, said selective material and said location determined based upon said panel defect information; and means for forming a conductive line to repair the panel defect.

5. The apparatus of claim 4 wherein said conductive line forming means comprises:

means for dispensing a film layer over an area of the panel which includes a panel defect; and means for removing excess film of said film layer.

6. The apparatus of claim 5 in which the selective material removed and a location and shape of the conductive line formed are prescribed based upon the type of panel defect.

7. A method for automatically testing and repairing a circuit panel, comprising the steps of:

applying a test signal to said circuit panel;

capturing a capacitance image of said panel while said test signal is applied;

identifying panel defects from said captured image;

storing panel defect information including defect type data and defect location data;

removing selective material from a location of said panel, said selective material and said location being determined from said panel defect information;

dispensing a film layer over an area of the panel which includes a panel defect; and forming a conductive line with said film to repair the panel defect.

8. The method of claim 7 further comprising the step of removing excess metallic film.

9. The method of claim 8 in which the selective material removed and a location and shape of the conductive line formed are prescribed based upon the type of panel defect.

* * * * *